United States Patent [19]
Afrashteh et al.

[11] Patent Number: 5,426,641
[45] Date of Patent: Jun. 20, 1995

[54] ADAPTIVE CLASS AB AMPLIFIER FOR TDMA WIRELESS COMMUNICATIONS SYSTEMS

[75] Inventors: Alireza Afrashteh, Falls Church, Va.; Nelson R. Sollenberger, Tinton Falls, N.J.

[73] Assignee: Bell Communications Research, Inc., Livingston, N.J.

[21] Appl. No.: 187,973

[22] Filed: Jan. 28, 1994

[51] Int. Cl.$^6$ .......................................... H04B 1/04
[52] U.S. Cl. ............................. 370/95.3; 330/277; 330/279; 455/116
[58] Field of Search .............. 379/79, 95.3; 455/69, 455/91, 115, 116, 117, 127; 375/59, 68, 71; 330/129, 130, 277, 279, 290

[56] References Cited

U.S. PATENT DOCUMENTS

| | | | |
|---|---|---|---|
| 4,849,991 | 7/1989 | Arnold et al. | 375/84 |
| 4,937,841 | 6/1990 | Chuang et al. | 375/94 |
| 4,941,155 | 7/1990 | Chuang et al. | 375/84 |
| 5,084,891 | 1/1992 | Ariyavisitakul et al. | 371/42 |
| 5,155,742 | 10/1992 | Ariyavisitakul et al. | 375/13 |
| 5,177,769 | 1/1993 | Arnold et al. | 375/60 |
| 5,212,831 | 5/1993 | Chuang et al. | 455/54 |
| 5,222,101 | 6/1993 | Ariyavisitakul et al. | 375/13 |
| 5,226,045 | 7/1993 | Chuang | 370/95.1 |
| 5,303,268 | 4/1994 | Tsutsumi et al. | 455/116 |
| 5,309,115 | 5/1994 | Hashimoto et al. | 455/116 |
| 5,337,006 | 8/1994 | Miyazaki | 455/116 |

OTHER PUBLICATIONS

S. A. Hetzel, A. Bateman and J. P. McGeehan,, *A LINC Transmitter*, Proceedings of the 41st IEEE Vehicular Technology Conference, May 19–22, 1991, St. Louis, Missouri, pp. 133–137.

A. Bateman, *The Combined Analogue Locked Loop Universal Modulator (CALLUM)*, Proceedings of the 42nd IEEE Vehicular Technology Conference, May 10–13, 1992, Denver, Colorado, pp. 759–763.

P. B. Kenington, R. J. Wilkinson and J. P. Marvill, *Broadband Linear Amplifier Design for a PCN Base-Station*, Proceedings of the 41st IEEE Vehicular Technology Conference, May 19–22, 1991, St. Louis, Missouri, pp. 155–159.

J. K. Cavers, *Amplifier Linearization Using a Digital Predistorter with Fast Adaptation and Low Memory Requirements*, IEEE Trans. on Vehicular Technology, vol. 39, No. 4, Nov. 1990, pp. 374–382.

Y. Nagata, *Linear Amplification Technique for Digital Mobile Communications*, Proceedings of the 39th IEEE Vehicular Technology Conference, May 1–3, 1989, San Francisco, Calif., pp. 159–164.

M. Faulkner, T. Mattsson, W. Yates, *Adaptive Linearisation Using Predistortion*, Proceedings of the 40th IEEE Vehicular Technology Conference, May 6–9, 1990, Orlando, Florida, pp. 35–40.

A. Bateman, D. M. Haines and R. J. Wilkinson, *Direct Conversion Linear Transceiver Design*, IEEE 5th International Conf. Mobile Radio and Personal Communications, Warwick, Dec. 1989, pp. 53–56.

R. Wilkinson, J. MacLeod, M. Beach and A. Bateman, (List continued on next page.)

*Primary Examiner*—Benedict V. Safourek
*Attorney, Agent, or Firm*—Leonard Charles Suchyta; Stephen M. Gurey

[57] ABSTRACT

In a TDM/TDMA portable radio communications system, the modulated RF signal transmitted by a portable handset unit is amplified for uplink transmission to a port by an adaptive class AB power amplifier. A class AB amplifier provides the necessary amplification for the low power levels to be output by the portable units, but must be biased just slightly "on" with no signal input for required maximum efficiency and linearity. In order to maintain the amplifier at a proper bias level over changing temperature conditions and free from the effects of device aging and device-to-device variations, the drain current of the amplifier is monitored each frame outside the burst interval in which the portable is transmitting and thus when no signal is present at its input. The drain current is then controlled by adjusting the gate voltage to compensate for any variations.

10 Claims, 3 Drawing Sheets

OTHER PUBLICATIONS

*Linear Transmitter Design for MSAT Terminals,* Proceedings for the International Mobile Satellite Conference, Ottawa, 1990, pp. 297–301.

M. J. Koch, R. E. Fisher, *A High Efficiency 835 MHz Linear Power Amplifier for Digital Cellular Telephone,* Proceedings of the 39th IEEE Vehiclar Technology Conference, May 1–3, 1989, San Francisco, Calif., pp. 17–18.

T. Nojima, S. Nishiki and K. Chiber, *High Efficiency Transmitting Power Amplifiers for Portable Radio Units,* IEEE Transactions, vol. E74, No. 6, Jun. 1991, pp. 1563–1570.

A. M. Saleh and D. C. Cox, *Improving the Power–Added Efficiency of FET Amplifiers Operating with Varying–Envelope Signals,* IEEE Trans. on Microwave Theory and Techniques, vol. 31, No. 1, Jan. 1983, pp. 51–56.

S. Ariyavisitakul and T–P Liu, *Characterizing the Effects of Nonlinear Amplifiers on Linear Modulation for Digital Portable Radio Communications,* IEEE Trans. on Vehicular Technology, vol. 39, No. 4, Nov. 1990, pp. 383–389.

D. Cox, *Portable Digital Radio Communications—An Approach to Tetherless Access,* IEEE Communications Magazine, vol. 27, No. 7, Jul. 1989, pp. 30–40.

D. Cox, *Universal Digital Portable Radio Communications,* Proceedings of the IEEE, vol. 75, vol. 75, No. 4, Apr. 1987, pp. 436–476.

ADAPTIVE CLASS AB AMPLIFIER FOR TDMA WIRELESS COMMUNICATIONS SYSTEMS

BACKGROUND OF THE INVENTION

This invention relates to providing efficient low-power linear RF amplification in the portable unit in a frequency-reusing wireless communications systems such as a time division multiplex/time division multiple access (TDM/TDMA) system used for low power portable digital telephony.

People by their very nature are highly mobile; no where is this more true than in modern day society with its myriad forms of travel. At the same time, many people increasingly have a need to be able to telephonically communicate with others particularly while they are on "the go", i.e. while they are moving.

However, this need for mobile communications, which existed for quite some time, has remained basically unsatisfied. Since telephones traditionally have cords, any movement of the telephone was traditionally limited by the length of its cord. For many years, only a veritable handful of telephones actually traveled with their users. These mobile telephones included aeronautical, marine and other forms of early radio telephones. Inasmuch as these mobile telephones were priced well beyond the affordability of the average telephone subscriber, none of these radio telephones ever encountered widespread use. Accordingly, for the vast majority of subscribers, a telephone set was installed at each subscriber location and there it remained unless it was reinstalled elsewhere. Thus, these subscribers either remained close to their telephone and thus restricted their mobility particularly in the anticipation of receiving a telephone call, or intentionally sought out a public or private telephone located along their route of travel whenever the need arose to place a telephone call.

Now with increasing sophistication of miniaturized electronic technology and decreasing attendant cost thereof, various vendors provide a number of devices (and/or services) that offer tetherless telephony. These devices, explained in more detail below, attempt to free a subscriber from being bound by the ambulatory constraints imposed by existing wireline telephone sets. In effect, each of these devices now permits subscribers effectively, at least to a certain extent, to take their telephone with them, obtain exchange access, and remain in communication wherever they go. These devices include cordless telephones, cellular mobile radio transceivers, public packet radio data network transceivers and radio pagers. As a growing number of consumers perceived the freedom of movement offered by these devices, a large demand was created for these devices. Moreover and not unexpectedly, as the prices of these devices continue to fall due to manufacturing economies and technical developments, the demand for these devices correspondingly continues to substantially increase. Specifically, more than 25 million cordless telephone sets are in use today throughout the United States with demand for these sets continuing to rise as the price of cordless telephones with increasing sophistication has remained within a $100.00 to $200.00 range. In addition, more than twelve million cellular telephone sets are currently in use throughout the United States. As the prices of various cellular sets have fallen to only a few hundred dollars today, the demand for these sets has increased precipitously. As a result, the number of installed sets has climbed at such an astonishing rate that in certain urban areas, such as New York, the number of sets in use at peak times is beginning to strain the capacity of the existing cellular network to handle the concomitant call traffic.

While, each of the present tetherless telephonic technologies possesses certain advantages, each technology also unfortunately has certain drawbacks that significantly restrict its use. In this regard, see, e.g., Cox, "Portable Digital Radio Communications—An Approach to Tetherless Access", IEEE Communications Magazine, Vol. 27. No. 7, July 1989 pages 30-40; and Cox, "Universal Digital Portable Radio Communications", Proceedings of the IEEE, Vol. 75, No. 4, April 1987, pages 436-476.

Specifically, as to cordless telephones, such a telephone consists of two transceivers: a base unit and a handset that collectively form a low power duplex analog radio link. The base unit is connected, typically by a subscriber to a wireline access point in a conventional telephone network in lieu of or as a replacement for a wireline telephone, in order to implement a tetherless substitute for a telephone cord. Once connected, the base unit appears to the telephone network as a conventional telephone. The base unit contains a transmitter and a receiver, and simple control and interface apparatus for dialing, accepting ringing, terminating calls and coupling voice from the telephone line to the transmitter and from the receiver within the base unit to the telephone line. The handset, which is truly portable, contains simple control logic for initiating, receiving and terminating calls with the base unit and for turning its own transmitter on and off. To provide true duplex operation, separate carrier frequencies are used by the transmitters in the base unit and handset. Since cordless telephones operate with very low input power to their transmitter, usually on the order of only several milliwatts, the handset generally utilizes several small rechargeable batteries as its power source. This enables the handset to be made relatively small, lightweight and to be continuously used for a relatively long period, typically several hours, before its batteries require recharging. Furthermore, the very low level of power radiated from the handset poses essentially no biological radiation hazard to its user.

Unfortunately, the primary disadvantage of cordless telephones is their highly limited service area. Because cordless telephones use relatively low transmitter power, these telephones have a maximum range that varies from typically a few hundred to a thousand feet, which in turn results in a very small service area. A secondary disadvantage associated with cordless telephones stems from the limited number of available frequencies. At present, only a few separate frequencies, typically up to 10 duplex channels, have been allocated by the Federal Communications Commission (FCC) for use by cordless telephones, but the FCC has recently added 15 duplex channels to increase capacity. Moreover, early cordless telephones by their very design have been very susceptible to co-channel interference. This interference arises by the simultaneous operation of two or more cordless telephones situated in close proximity to each other, such as in an immediate neighborhood of a residential area. In a very small geographic area with a very low density of users, a reasonable probability exists that within this area one or more duplex pairs will not be in use at any one time, and, as such, this interference will not occur therein. Nevertheless, in an effort to avoid this interference, relatively sophisticated cordless telephones are now capable of operating on any one of a number of preprogrammed duplex pairs with either the user or the telephone itself selecting, manually in the case of the user and automatically by the telephone, the specific pair that is to be used at any one time. Unfortunately, if a sufficient number of cordless telephones are in use in a very densely populated area, such as an apartment building, pair selection may not be sufficient to eliminate the expected incidences of co-channel interference that results from undisciplined and uncoordinated duplex pair assignment and the resulting chaos experienced by users situated therein. In addition, since cordless telephones rely on analog modulation of a duplex pair, conversations occurring over a cordless telephone are highly vulnerable to eavesdropping. Furthermore, a cordless telephone only provides limited protection against unauthorized long distance or message units calls being made there through. While preprogrammed digital or tone access codes are being used between individual handset-base unit pairs and provide sufficient protection against casual attempts at unauthorized access, these codes are not sufficiently sophisticated to successfully deter a determined orderly assault on a cordless telephone by an unauthorized user. Furthermore, while cordless telephones provide limited portable radio access to a wireline access point, from a network standpoint cordless telephones do not eliminate the need for telephone lines, i.e. a customer drop, to be run to each subscriber.

Nonetheless, in spite of these severe service restrictions, cordless telephones are immensely popular for the freedom, though very limited, that they furnish to their users.

In contrast to the very limited range provided by cordless telephones, cellular mobile radio systems accommodate wide ranging vehicular subscribers that move at relatively high speeds. These systems utilize a relatively high power 850 MHz transmitter, typically operating at an input of approximately 0.5 watt to several tens of watts, in a mobile unit with a relatively high efficiency antenna to access a wireline telephone network through a fixed cell-site (base station). The base station also uses a high power transmitter in conjunction with a tall antenna, typically erected on a tower or tall building, to provide a relatively large coverage area. Due to the expense, typically ranging to $300,000 exclusive of land and building costs, and the antenna size associated with each base station, the least number of base stations are often used to cover a given area. Nonetheless, this arrangement generally provides a circular service area centered on a base station with a radius of approximately 5-10 miles therefrom. In use, a cellular radio system that covers a large region often encompassing a city, its suburbs and major access highways typically includes a number of geographically dispersed base stations. The base stations, containing radio receivers and transmitters and interface and control electronics, are connected by trunks to and coordinated and controlled by one or more Mobile Telephone Switching Offices (MTSOs) that, in turn, also provide access to the conventional wireline telephone network. All of the duplex radio channels available to the entire system are sub-divided into sets of channels. The radio equipment in each base station has the capability of using channels from one of the channel sets. These sets are allocated to the base station in a pattern that maximizes the distance between base stations that use the same sets so as to minimize average co-channel interference occurring throughout a service region. One or more channels are designated for initial coordination with the mobile sets during call setup.

Each mobile (or hand-held) cellular transceiver used in the system contains a receiver and a transmitter capable of operating on any duplex radio channel available to the cellular system. Calls can be made to or from any mobile set anywhere within the large region covered by a group of base stations. The control electronics in the mobile transceiver coordinates with a base station on a special call setup channel, identifies itself, and thereafter tunes to a channel designated by the base station for use during a particular call. Each duplex channel uses one frequency for transmission from base-to-mobile and a different frequency for transmission from mobile-to-base. The signal strength of calls in progress is monitored by the base stations that can serve those calls. Specifically, when the signal strength for a given call drops below a predetermined threshold, typically due to movement of the cellular subscriber from one cell to another, the MTSO connected to that base station coordinates additional signal strength measurements from other base stations which surround the station that is currently handling the call. The MTSO then attempts to switch ("handoff") the call to another duplex channel if one of the other base stations is receiving a stronger signal than that being received at the base station that is currently handling the call. This handoff of calls, totally transparent to the cellular subscriber, preserves the quality of the radio circuit as the subscriber moves throughout the service region. Moreover, calls are handed off from one MTSO to another, as the subscriber transits from one service area into another. Inasmuch as frequency usage is coordinated, relatively efficient use is made of the available frequency spectrum while minimizing the likelihood co-channel interference. In each different geographic service area within the United States, there are two competing cellular systems using different frequencies.

Though cellular mobile radio systems provide wide range, these systems suffer various drawbacks. First, cellular systems were originally designed for use in motor vehicles whose electrical systems could readily provide sufficient power. While portable hand-held cellular transceivers do exist, they must operate with sufficient transmitter input power, typically at least 0.5 watt, to reliably reach a base station. This, in turn, requires that a relatively large battery must be used within the portable cellular transceiver. However, due to the limits of present rechargeable battery technology, the amount of time that the portable transceiver can be used before it requires recharging is often quite limited. Furthermore, the cost of these rechargeable batteries and hence of the portable transceiver is rather high. Moreover, high radiated power levels, such as that which emanate from a mobile or portable cellular transceiver, may be sufficient to pose a potential biological radiation hazard to its user. Furthermore, since cellular systems were not designed to compensate for radio attenuation occurring within buildings, these systems are only able to provide little, if any, service within a building. Low power portable cellular transceivers are not operationally compatible with large cell sizes, designed to match the needs of fast moving vehicular users, and thus often provide poor communication in many areas within these cells. In addition, since cellular systems rely on merely frequency modulating a carrier with voice or data, these systems are also susceptible to eavesdropping. Lastly, from a network perspective, cellular systems are quite inefficient. Due to the inclusion of MTSOs with trunks connected to individual base stations, backhaul of cellular traffic over wired trunks often occurs over several miles prior to its entrance into the wireline network, thereby resulting in a wasteful overbuild of network transport facilities.

Public packet radio data networks presently exist to handle infrequent bursts of digital data between a fixed base station and a number of portable data transceivers. The fixed site has a transmitter that uses several tens of watts; while each portable data transceiver uses a transmitter that operates at a level of several watts. As such, reliable coverage is provided over a service area that may extend several miles in radius from a base station. Individual base stations are connected by a fixed distribution facility to a controller that can, in turn, be connected to either a local exchange network, to handle voice-band data, or a packet-data network which itself interconnects various computers. Multiple users contend for transmission time on typically a single radio channel. Data transmissions on the channel are set up in either direction through bursts of coordinating data, handshaking, that occur between a base station and a portable data transceiver. Appropriate controller and radio link protocols are used to avoid packet collisions. Once a data transfer is complete between that base station and a data transceiver, the channel is immediately available for reuse by others. Although data bursts are transmitted at relatively high power, each burst is transmitted for only a short duration. As such, the average power consumption for a portable data transceiver is far less than that associated with a portable cellular transceiver thereby allowing physically smaller internal batteries to be used with portable data transceivers than those used in portable cellular transceivers. Nevertheless, the high radiated power levels associated with a portable data transceiver again pose a potential biological radiation hazard to its user. In addition, these networks disadvantageously suffer from limited digital transmission capacity which restricts these networks to carrying short data bursts and not voice, and, like cellular systems, experience coverage restraints when used within buildings.

In contrast to the tetherless systems discussed above, radio paging systems provide simple unidirectional transmission from a fixed location to a specifically addressed portable pager, which when received provides an alerting tone and/or a simple text message. Paging systems provide optimized one-way communication over a large region through a high power transmitter, typically a few kilowatts, that uses high antennas at multiple sites to provide reliable coverage throughout the region. Satellite based paging systems are also in operation to provide extended service regions. Since a pager is merely a receiver with a small annunciator, its power requirement is very low. As such, a pager is quite small, light weight, reliable, relatively low cost, and can operate for long intervals before its batteries need to be recharged or replaced.

Due to the advantages in size, cost and operating duration offered by pocket pagers, attempts exist in the art, to impart limited two-way communication into paging systems which are themselves highly optimized for one-way traffic. One such attempt includes incorporation of an "answer back" message through "reverse" transmission links between the individual pagers and the fixed sites. While these attempts have met with great difficulty, these attempts nevertheless indicate that a substantial demand exists for an inexpensive two-way portable truly tetherless telephonic service that overcomes the range limitations associated with cordless telephones and the weight and cost limitations associated with portable cellular systems.

Furthermore, various intelligent network services are now being offered by the local telephone operating companies in an attempt to provide wireline subscribers with a certain degree of call mobility when they are away from their own wireline telephones. These services include call transfer and call forwarding. Both call transfer and call forwarding allow a subscriber to program a local switch, using any pushbutton telephone, to transfer all subsequently occurring incoming calls that would otherwise be routed to this subscriber's telephone to a telephone associated with a different wireline telephone number that the subscriber desires anywhere in the world either for a given period of time, as in call transfer, or until that subscriber appropriately reprograms the switch with a different forwarding number, as in call forwarding. In this manner, the subscriber can, to a certain extent, continually instruct the telephone network to follow his or her movements and thereby route his or her incoming calls to a different number in unison with that subscriber's actual route of travel. Unfortunately, with these services, the subscriber must manually interact with the network and continually enter a new forwarding telephone number(s) coincident with his or her continuing travel such that the network is always cognizant of the current telephone number to which his calls are to be forwarded.

Thus, a substantial overall need exists in the art for a truly portable personal communication technology that is designed for pedestrian use and which utilizes small, lightweight and relatively inexpensive portable transceivers while eliminating, or at least substantially reducing, the performance drawbacks associated with the use of currently existing tetherless telephonic technologies in portable communication applications.

In an attempt to provide this needed technology, the art has turned to low power portable digital telephony. In essence, this technology, similar to cellular radio, uses a fixed base unit (hereinafter referred to as a port) and a number of mobile transceivers (hereinafter referred to as portables) that can simultaneously access that port on a multiplexed basis. However, in contrast to cellular radio, portable digital telephony, or wireless communications, uses low power multiplexed radio links that operate on a time division multiplexed/time division multiple access (TDM/II)MA) basis to provide a number of separate fully duplex demand-assigned digital channels between a port and each of its associated portables. Specifically, each port would transmit time division multiplexed (TDM) bit streams on a predefined carrier frequency, with, in turn, each portable that accesses that port responding by transmitting a TDMA burst on a common though different predefined carrier frequency from that used by the port. Quadrature phase shift keying (QPSK), with an inter-carrier spacing of 150 to 300 KHz and within a given operating frequency band situated somewhere between approximately 0.5 to 5 GHz would be used by both the port and portables. The RF power generated by the transmitter in the portable would range between 5–20) milliwatts or less on average and provide a range of several hundred to a thousand feet. As such, the resulting low radiated power would pose essentially no biological radiation hazard to any user. In addition, the port antenna would be relatively small and suitable for mounting on a utility or light pole. With this transmission range, a port could simultaneously serve typically 20–30 separate locally situated portables. The same TDM channels would be reused at ports that are spaced sufficiently far apart to reduce co-channel interference to an acceptably low level but yet conserve valuable spectrum. To provide access to the wireline telephone network, each port would be interfaced, typically through a conventional fixed distribution facility, over either a copper or fiber connection to a switching machine at a local central office. The switching machine would be suitably programmed, in a similar manner as is an MTSO, to controllably and automatically handoff calls from one port to another as subscribers move their portables from port to port.

Due to the very limited transmitter power, each portable is anticipated to be very light-weight, physically small and provide a relatively long operating life between battery recharging or replacement. The cost to a subscriber for a portable is expected, through very large scale integrated (VLS D circuit implementations, to reside in the range of $100.00 to $350.00. In addition, each port would require a relatively small electronic package and carry an overall expected cost of less than $5,000.00—which is far less, by at least an order of magnitude, than that of a current cellular base station. Moreover, the digital data carried on each channel could be readily encrypted to provide a desired degree of security and privacy against eavesdropping. Furthermore, with this technology, a port antenna, due to its small size, could be readily moved within a building to cope with signal attenuation occurring therein. Port spacings would be properly established within the building and frequency reuse would be properly controlled between these ports to provide portable service having an acceptably low level of co-channel interference to a high density of users situated therein.

From a network perspective, low power portable digital telephony is extremely attractive. At present, approximately $50–100 billion is invested by local operating telephone companies in costs associated with copper subscriber loops that run from distribution points to local telephone company demarcation points on individual customer drops. For a local telephone company, the per-subscriber cost of installing and maintaining a subscriber loop is generally greater at the loop end closest to a subscriber than at the far end thereof since the loop end is more dedicated to that subscriber than the far end is. Given the range provided by portable low power telephony, ports can be appropriately positioned throughout an area to provide radio link based exchange access and thereby substitute inexpensive mass produced VLSI circuitry for costly dedicated copper loops that would otherwise emanate from a distribution facility to an individual subscriber. Hence, by installing various ports throughout for example a building, significant labor intensive installation and maintenance tasks associated with rewiring of telephone drops and relocation of telephone equipment would be eliminated with substantial savings being advantageously realized in attendant subscriber costs as people are moved from office to office therein.

Now, with the attractiveness of low power portable digital telephony being readily apparent, its success, in great measure, hinges on achieving satisfactory performance through the use of TDMA. Various aspects of TDMA have been treated in prior art patents and patent applications such as U.S. Pat. No. 4,849,991, entitled "Method and Circuitry for Determining Symbol Timing for Time Division Multiple Access Radio Systems," issued Jul. 18, 1989 to H. W. Arnold and N.R. Sollenberger, the latter one of the co-inventors herein; U.S. Pat. No. 4,937,841, entitled "Method and Circuitry for Carrier Recovery for Time Division Multiple Access Radio Systems," issued Jun. 26, 1990 to J. C. Chuang and N. R. Sollenberger; U.S. Pat. No. 4,941,155, entitled "Method and Circuitry for Symbol Timing and Frequency Offset Estimation in Time Division Multiple Access Radio Systems," issued July 10, 1990 also to J.C. Chuang and N.R. Sollenberger; U.S. Pat. No. 5,084,891, entitled "A Technique for Jointly Performing Bit Synchronization and Error Detection in a TDM/YDMA System," issued Jan. 28, 1992 to S. Ariyavisitakul, L.F. Chang and N. R. Sollenberger; U.S. Pat. No. 5,155,742, entitled "Time Dispersion Equalizer Receiver with a Time-Reversal Structure for TDMA Portable Radio Systems", issued Oct. 13, 1992 to S. Ariyavisitakul and H.W. Arnold; U.S. Pat. No. 5,177,769, entitled Digital Circuits for Generating Signal Sequences for Linear TDMA Systems", issued Jan. 5, 1993 to H.W. Arnold and N.R. Sollenberger; U.S. Pat. No. 5,212,831, entitled "Method and Apparatus for Autonomous Adaptive Frequency Assignment in TDMA Portable Radio Systems", issued May 18, 1993 to J.C. Chuang and N.R. Sollenberger; U.S. Pat. No. 5,222,101 entitled "Phase Equalizer for TDMA Portable Radio Systems", issued Jun. 22, 1993 to S. Ariyavisitakul and tt. W. Arnold; and U.S. Pat. No. 5,226,045 entitled "Method and Apparatus for Autonomous Selective Routing During Radio Access in TDMA Portable Radio Systems", issued Jul. 6, 1993 to J.C. Chuang. Co-pending patent application Ser. No. 010,111 filed Jan. 28, 1993 by S. Ariyavisitakul, J.C. Chuang, and N.R. Sollenberger, discloses a method and apparatus for dynamic power control in TDMA portable radio system; co-pending patent applications Serial Nos. 100,515 and 100,020 both filed Jul. 30, 1993 by J.C. Chuang and N.R. Sollenberger, each disclose a method and apparatus for synchronizing timing among the ports in a TDMA portable radio system; and co-pending patent applications Ser. Nos. 142,533 and 142,553 both filed Oct. 22, 1993 by H.W. Arnold, D. Devasirvatham, N.R. Sollenberger, L.G. Sutliff and V.K. Varma, each disclose a system, a method, and apparatus for sharing spectrum between a TDMA portable radio system and a fixed microwave system.

Because of limited available spectrum, it is essential for a personal communications system to use a spectrally efficient linear modulation technique such as, as aforenoted, quadrature phase shift keying (QPSK) with spectral shaping, or 4-QAM (quadrature amplitude modulation). With such modulation, the signal envelope of the transmitted signal is, in general, not constant. In order to faithfully reproduce the envelope of the RF signal, which is varying at a rate proportional to the symbol rate, a linear amplification technique is required to amplify the signal delivered for transmission to the antenna. In addition to enabling the information of the signal to be faithfully preserved and thus decoded, a linear amplification technique maintains the compact spectrum of the signal and minimizes interference with other channels that are nearby in frequency. A power efficient but nonlinear class C based transmitter that is used in present cellular systems, therefore, cannot be easily utilized. One approach to achieve linear amplification is to use class A power amplifiers (or class AB or B). Since, however, a class A amplifier operates far below saturation and with a substantial quiescent power drain, its efficiency is usually below 5% which puts a large burden on the battery life of a portable handset. Since battery life is directly dependent upon power consumption, decreasing power consumption is an effective way of achieving longer battery life. Considering that the battery is the largest device in many portable units, decreasing power consumption can also yield an advantageous corresponding size and weight reduction of the portable unit. Furthermore, an additional benefit of low-power consumption due to higher efficiency is a reduction in heat generated due to internal power dissipation.

One way to achieve efficient yet linear RF power amplification is to use power efficient nonlinear amplifiers in combination with a linearization technique. Various techniques have been proposed for linearizing amplifier operation in classes B or C. A LINC (linear amplification using nonlinear components) concept was introduced in the 1930s. The LINC transmitter relies upon the fact that a bandpass signal, which may have both amplitude and phase variations, can be split into two constant envelope phase modulated components. These components are separately amplified, using highly nonlinear but very efficient amplifiers, and then summed together. In spite of the fact that its theoretical efficiency can be very high, in a practical LINC transmitter the imbalance between the power gain and delay (or phase) of the two RF paths (especially for wideband applications) and the different non-linear characteristics of the two amplifiers limits the overall performance of the amplifier. Furthermore, in the past the accurate generation of the two constant envelope phase modulated components has been difficult because a required $\cos^{-1}$ phase term was not readily implemented. Modem Digital Signal Processing (DSP) technology can help (see S. A. Hetzel, A. Bateman, and J.P. McGeehan, "A LINC Transmitter," Proceedings of the 41st IEEE Vehicular Technology Conference, May 19-22, 1991, St. Louis, Mo., pp. 133-137) to overcome this problem, but overall practical efficiency, especially for amplifiers at 2 GHz and higher is too low for considering this technique as a viable solution, and is especially true for amplifiers with RF output power of less than one watt, as is the case in the portable unit in a low power TDM/TDMA digital telephony system. Analog feedback techniques combined with LINC have also been investigated to overcome nonlinear effects (see A. Bateman, "The combined Analogue Locked Loop Universal Modulator (CALLUM)," Proceedings of the 42nd IEEE Vehicular Technology Conference, May 10-13, 1992, Denver, Co., pp. 759-763).

Feed-forward correction (see, e.g., P.B. Kenington, R.J. Wilkinson, and J.P. Marvill, "Broadband Linear Amplifier Design for a PCN Base-Station," Proceedings of the 41st IEEE Vehicular Technology Conference, May 19-22, 1991, St. Louis, Mo., pp. 155-159) is a technique in which a sample of the RF power amplifier's input signal is subtractively combined with a sample of its output signal. The resultant error signal is amplified with a linear amplifier and then added back into the output of the main amplifier at the proper amplitude and phase to cancel the distortion. Precise balance of phase, delay, and amplitude within the feed-forward loop is necessary for good performance. A major difficulty is to maintain this precise balance in the face of changing amplifier conditions with temperature and age. In addition, the linear amplifier used to amplify the distortion products detracts from the power efficiency of the system. Thus, this technique is efficient for RF amplifiers with output power well above one watt; otherwise the improvement in the main amplifier efficiency will be lost due to the power consumption in the linear amplifier used to amplify the distortion products.

Adaptive pre-distortion (see, e.g., J. K. Cavers, "Amplifier Linearization Using a Digital Predistorter with Fast Adaptation and Low Memory Requirements," IEEE Trans. on Vehicular Technology, Vol. 39, No. 4, November 1990; Y. Nagata, "Linear Amplification Technique for Digital Mobile Communications," Proceedings of the 39th IEEE Vehicular Technology Conference, May 1-3, 1989, San Francisco, CA, pp. 159-164; and M. Faulkner, T. Mattsson, W. Yates, "Adaptive Linearisation Using Predistortion", Proceeding of the 40th IEEE Vehicular Technology Conference, May 6-9, 1990, Orlando, Fl., pp. 35-40) is a technique in which a sample of the RF power amplifier output is detected and used to adapt pre-distortion circuits which process the original baseband signal to correct for amplifier non-linearity. Adaptation is essential to compensate for amplifier and modulator thermal effects and also for loading effects of the amplifier. Although this is a powerful technique for narrow band applications, problems would occur with the predictability of intermodulation products. Furthermore, dynamic range problems make this technique less attractive for applications that employ power control such as may be employed in a low power TDM/TDMA digital telephony system (see aforenoted co-pending patent application, Serial No. 010,111). Again, this method is appropriate for amplifiers with output power above one watt. Power dissipation in the demodulator and DSP make it unattractive for use with amplifiers with less than one watt of RF output.

Closed loop feedback (see, e.g., A. Bateman, D.M. Haines and R.J. Wilkinson, "Direct Conversion Linear Transceiver Design," IEE 5th International Conf. Mobile Radio and Personal Communications, Warwick, Dec. 1989, pp. 53-56; and R. Wilkinson, J. MacLeod, M. Beach, and A. Bateman, "Linear Transmitter Design for MSAT Terminals", Proceedings for the International Mobile Satellite Conference, Ottawa, 1990, pp. 297-301) is a technique in which a portion of the RF amplifier output signal is demodulated and is fed back into the baseband to correct for distortion of the amplifier. This way an efficient class-C amplifier can be used and yet achieve linear amplification. A major problem with this technique is maintaining the stability of the feedback loop. This method also requires that the output signal be down converted and demodulated which requires power consuming circuits.

In an envelope restoration technique (see, e.g., M. J. Koch and R. E. Fisher, "A High Efficiency 835 MHz Linear Power Amplifier for Digital Cellular Telephone," Proceedings of the 39th IEEE Vehicular Technology Conference, May 1-3, 1989, San Francisco, CA, pp. 17-18) the modulated signal is split into two pans. The modulated signal is passed through a limiter (it will contain only phase information), to obtain one part, and then a class C amplifier is used for amplification. The other part is obtained by detecting the amplitude variation of the RF signal, and it modulates the supply voltage to the RF amplifier to restore the signal's envelope. For better performance, usually a sample of the output is fed back into the supply voltage modulation circuit. Since the output power is fixed, the class C amplifier can operate at its most efficient point. There are losses, however, in modulating the supply voltage. The aforenoted Koch et al reference reported 50% efficiency, but third order intermodulation products are only 30 dB below the main signal. Since a class S amplifier which is very efficient is used for supply voltage modulation, this method can be used for amplifiers with output power as low as one watt. This method is improved upon by Toshio Nojima, S. Nishiki, and K. Chiber in "High Efficiency Transmitting Power Amplifiers for Portable Radio Units," IEEE Transactions, Vol. E74, No. 6, June 1991. The improved method uses digital control circuits for the envelope generation function, and it also applies negative feedback to a driver amplifier. The main class C amplifier uses supply voltage modulation. Using this improved upon envelope restoration method, higher efficiency and lower intermodulation products have been achieved. Neither method, however, appears to be efficient if the RF amplifier output is in the 200 mw range.

All the linearization techniques discussed above require power consuming control circuits. This is not likely to be a problem for power amplifiers with RF output power in the range of one watt or higher, which is typical of amplifiers used in vehicular cellular systems. When the amplifier output power is in the range of a fraction of a watt, as would be the power output of a low-power portable unit's RF amplifier, none of these techniques will be efficient since a significant percentage of energy will be consumed in the linearization circuits. Furthermore, in some of the techniques discussed hereinabove, the output power of the RF amplifier is normally fixed. The linearization circuits and the amplifier itself are optimized for a fixed output power, with a variation of only a few dBs possible. The methods using class C amplifiers may not, therefore, exhibit good performance when the output power control is adjusted over a significant range. As is discussed in the aforenoted co-pending patent application Serial No. 010,111, power control is useful in wireless access systems to mitigate interference and to reduce battery drain.

For signals with a varying envelope, such as QPSK with spectral shaping, Adel A.M. Saleh and D.C. Cox in "Improving the Power-Added Efficiency of FET Amplifiers Operating with Varying-Envelope Signals," IEEE Trans. on Microwave Theory and Techniques, Vol. 31, No. 1, January 1983, pp. 51–56, propose gate bias control for improving efficiency of linear class A FET power amplifiers. The control voltage is proportional to the envelope of the RF signal. This technique will increase the efficiency by about 50% which is very effective, but it may not be adequate, especially when the amplifier efficiency is around 5–10% before gate bias control. S. Ariyavisitakul and T-P. Liu in "Characterizing the Effects of Nonlinear Amplifiers on Linear Modulation for Digital Portable Radio Communications," IEEE Trans. on Vehicular Technology, Vol. 39, No. 4, November 1990, have also proposed gate bias control using the RF signal envelope. With this method, an efficiency as high as 40% was estimated. However, in the transistor model, the FET transconductance is assumed to be constant, or the relation between drain current and gate voltage is a straight line from the compression point to zero drain current. This assumes perfect linearity below the compression point. The achievable relation, however, is not a straight line.

SUMMARY OF THE INVENTION

An object of the present invention is to provide efficient low-power linear amplification of the RF signal delivered for transmission to the antenna of a portable unit in a TDMA portable digital telephony system.

In accordance with the present invention such efficient linear amplification is provided by a class AB amplifier with adaptive biasing that maintains the bias point at an optimum level at which the amplifier exhibits good efficiency and adequate linearity for a TDMA digital portable radio link. Such an optimum level is one at which the amplifier is just slightly "on". Since a class AB amplifier's optimum bias point differs from device-to-device and will normally change with temperature causing either efficiency or linearity to drift to an unacceptable region, adaptive biasing can eliminate undesirable bias point variations. Specifically, adaptation is used to keep the quiescent drain current, with no RF input, constant across a wide temperature range. Since, for a TDMA system, the portable handset transmitter is "on" for only a short period of time during a frame, drain current with no input RF power is monitored between TDMA bursts and controlled by adjusting the gate voltage of the amplifier. In this manner the bias point of the amplifier can be maintained at its optimum level regardless of temperature variations, aging effects, and device-to-device variations.

Advantageously, power dissipation of the corrective circuitry is very small and thus will not significantly lower the efficiency of the amplifier. Furthermore, RF power output can be controlled efficiently.

DETAILED DESCRIPTION

Figure 1:
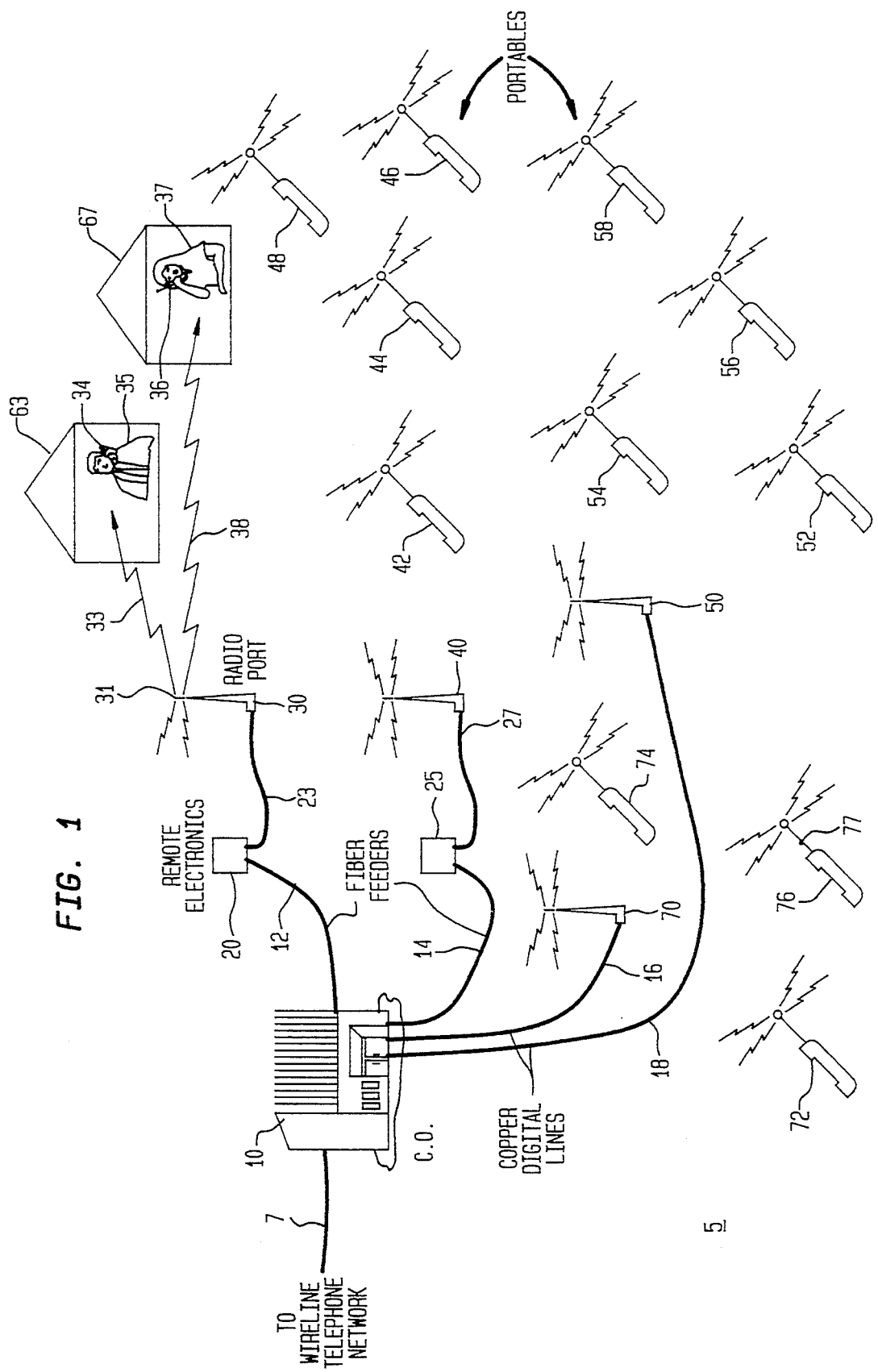
FIG. 1 shows a wireless communications system using radio ports to provide tetherless communications.

An overall diagram of a low power portable wireless communications TDM/TDMA digital telephony system 5 is shown in FIG. 1. Low power digital portable telephony utilizes a fixed base unit (referred to as a "port") and a number of mobile transceivers (each of which is referred to as a "portable" or "portable handset unit"). Through use of time division multiple access (TDMA), each portable can access the port through a separate demand-assigned TDMA channel to carry duplex communication on a time division multiplexed (TDM) basis there between. The RF power generated by the transmitter in each portable would range between 5–20 milliwatts on average and provide a range of several hundred to a thousand feet between a port and each of its portables. To accommodate a relatively large service area, several ports are used with individual calls being successively handed off from port to port as their corresponding callers carry their portable handsets from the service area associated with one port to that of an adjacent port. An appropriate switch (not shown) which is located within a local central end office is suitably programmed to operate in a similar manner as does a mobile telephone switching office in order to controllably handoff calls from port to port as the callers transit corresponding local service areas associated therewith.

Specifically, system 5 contains four ports 30, 40, 50 and 70 and respective portable handset units 34 and 36; 42, 44, 46 and 48; 52, 54, 56 and 58; and 72, 74 and 76. The ports themselves are connected to the switch located within central office 10 to provide access to a wireline telephone network. This connection can typically occur in one of two ways: either through copper digital lines 16 and 18 for illustratively ports 70 and 50, respectively, or via intermediary copper digital lines 23 and 27 to remote electronics 20 and 25 for illustratively ports 30 and 40, respectively. The remote electronics contain fixed distribution and concentration facilities for multiplexing traffic, in addition to that provided by ports 30 and 40, onto fiber feeders 12 and 14 which, in turn, feed central office 10. The switch located within the central office is connected, through trunk 7, to the wireline telephone network.

Each port would transmit time division multiplexed (TDM) bit streams on a predefined carrier frequency using quadrature phase shift keying (QPSK) modulation, with an inter-carrier spacing of 150 to 300 KHz and within a given operating frequency band situated somewhere between approximately 0.5 to 5 GHz. With this transmission range, a port could simultaneously serve as many as typically 20 separate locally situated portables that each carries digitized speech at a bit rate of 16 kbits/second. Here, ports 30, 40, 50 and 70 respectively serve portable handset units 34 and 36; 42, 44, 46 and 48; 52, 54, 56 and 58; and 72, 74 and 76. The same TDM channels would be reused at different ports that are spaced sufficiently far apart, such as ports 30 and 70, to reduce co-channel interference to an acceptably low level but yet conserve valuable spectrum. However, adjacent ports would be situated sufficiently close together in order to provide an appropriate degree of overlap of their respective service areas thereby ensuring no loss of coverage occurs during call handoff. Furthermore, each port utilizes a suitable antenna, such as antenna 31 for port 30, to carry its TDM transmissions to its associated portables and receive TDMA bursts therefrom. Given the carrier frequencies being used, each of these antennas is relatively small and suitable for mounting on a utility or light pole or within an office building. Each portable handset unit similarly uses its own built-in antenna, such as antenna 77 on unit 76, to receive the TDM transmissions from its associated port and transmit TDMA bursts thereto.

Inasmuch as system 5 replaces local copper drops and telephone cords with short range low power radio links, ambulatory callers are provided with completely tetherless access. Accordingly, through radio links 33 and 38, illustrative callers 35 and 37 located within respective residences 63 and 67 are completely free to move within the entire service area provided by system 5, i.e. that provided by ports 30, 40, 50 and 70, while advantageously maintaining continuity of their existing telephone conversations as well as being able to place calls through other ("non-home") ports as their travel progresses.

Each port continuously transmits on a TDM basis, while portables transmit in bursts on a TDMA basis to their associated port. Two different carrier frequencies are used to carry communication between each port and a portable: one frequency, frequency f1 for port 30, to carry communication from that port to each of its portables (downlink transmission) and another frequency, frequency f2 for port 30, to carry communication from each of these portables to this port (uplink transmission). Although adjacent ports use different pairs of frequencies, one particular uplink frequency being associated with each downlink frequency, these carrier frequencies are also reused for ports that are spaced sufficiently far apart from each other to conserve spectrum. By employing the procedure of the aforenoted U.S. Pat. No. 5,212,831 issued May 18, 1993, which is incorporated herein by reference, the downlink frequencies of all ports (and thus that port's associated uplink frequency) are assigned so as to maintain an acceptable low level of co-channel interference at each port.

As one of the portable users desires to connect to the telephone network, that person's portable must select a channel and initiate an access protocol. Selecting a channel (i.e. a port to communicate with) requires determination of the "best" port having a vacant time slot. A "best" port is one determined by the portable to have the highest signal to impairment (SIR) ratio or other quality measure. Generally, this is likely to be that port which is closest to the portable. Thus in FIG. 1, portable 74 would most likely access port 70. Various topological and meteorological conditions, however, can affect the quality of transmission so that the nearest port may not be the "best" port for a portable to access. Therefore, in FIG. 1, the "best" port for portable handset 74 may not be the nearest port 70, but may rather be port 40 or port 50. The "best" port may also not be available. Although the system shown in FIG. 1 shows only a limited number of portable handset units associated with each port, in actual practice, however, many more portables may be communicating through a port in a particularly high traffic area thereby occupying all the vacant time slots on the channel. The "best" port with respect to signal quality may not, therefore, be the "best" available port. The aforenoted U.S. Pat. No. 5,226,045 issued Jul. 6, 1993 discloses a method and apparatus for selecting a "best" available port.

The RF signal generated by the QPSK modulator in each portable unit is amplified for transmission by a power amplifier which, as aforedescribed, must be efficient and linear for optimum performance. In accordance with the present invention, the power amplifier in each portable handset unit is a class AB amplifier with adaptive biasing. As is well known in the art, a class AB amplifier will achieve linear amplification and good efficiency for narrowband RF signals. The optimum bias point is one at which the amplifier is just slightly "on". If the amplifier is "off" or slightly negative, serious distortion is likely, and if the amplifier is "on" too much, then efficiency deteriorates quickly. Maintaining the quiescent bias point at the proper level is thus critical to amplifier performance, i.e., linearity and efficiency. Various factors are likely to affect the bias point. For example, different devices (FETs) will have slightly shifted gate voltage-drain current characteristics. Thus, the bias point cannot be just fixed for a class of devices but must be determined device-by-device. Also, as the temperature of the device changes, the gate voltage-drain current characteristics curves will dramatically change thus requiring adjustment of the bias point. Furthermore, over a long-term period of operation the gate voltage-drain current characteristics will also vary thereby changing the optimum bias point. In summary, therefore, the quiescent bias point must be maintained at its optimum level throughout amplifier operation if the desired linearity and efficiency are to be achieved. During normal RF amplifier operation, however, a signal is always present at the input thus precluding measurement and adjustment of the quiescent drain current. In accordance with TDMA portable handset burst operation, however, the transmitter is "on" for only a portion of each digital frame. Thus, and in accordance with the present invention, during the "off" periods of each frame, the drain current with no RF input is measured and controlled by adjusting the gate voltage.

Figure 2:
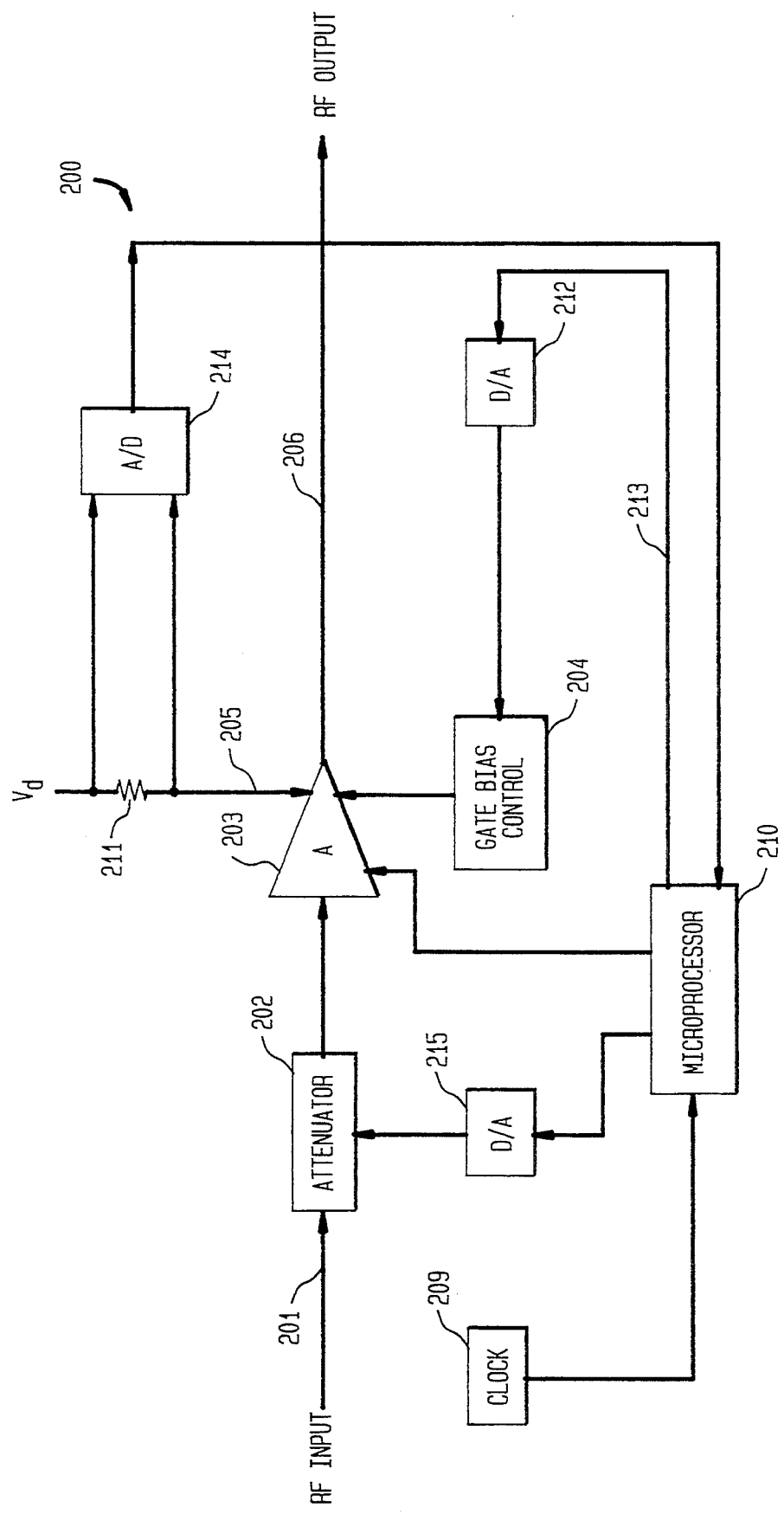
FIG. 2 is a schematic circuit configuration of an adaptive class AB amplifier in accordance with the present invention and as incorporated with other circuitry of the portable handset units in the system of FIG. 1.

With reference to FIG. 2, a schematic block diagram of an adaptive class AB amplifier 200 is shown. The RF input QPSK modulated signal from the modulator (not shown) on lead 201 is passed through an attenuator 202 used for power control. Attenuator 202 is used to control the power output supplied to the antenna (not shown) for transmission and will be described hereinafter. The attenuated RF input modulated signal is inputted to power amplifier 203 which provides an essentially fixed gain. Amplifier 203 is a conventional power amplifier, maintained in a class AB mode by means of selection of a quiescent point, the quiescent drain current, $I_{DO}$, supplied on lead 205 during periods of no input signal. By careful selection of $I_{DO}$, amplifier 203 provides good efficiency and linearity for the necessary power output, on lead 206, of less than one watt. Although achievable power gain with class AB operation is lower than class A using a similar transistor, use of a high gain transistor, such as a MESFET, mitigates this problem. Class AB linearity is dependent upon the linearity of drain current versus gate voltage of the MESFET. Class AB amplifiers are also sensitive to the variation of drain current with gate voltage near pinch-off. A fast pinch-off helps the amplifier to operate with much better linearity or lower intermodulation products. Without the adaptation technique of the present invention the temperature sensitivity of $I_{DO}$ over the temperature range of 0° C.–70° C. would cause it to vary as much as 200%, thus dramatically affecting the linearity and efficiency of the amplifier. This problem is eliminated using the adaptation technique of the present invention.

Figure 3:
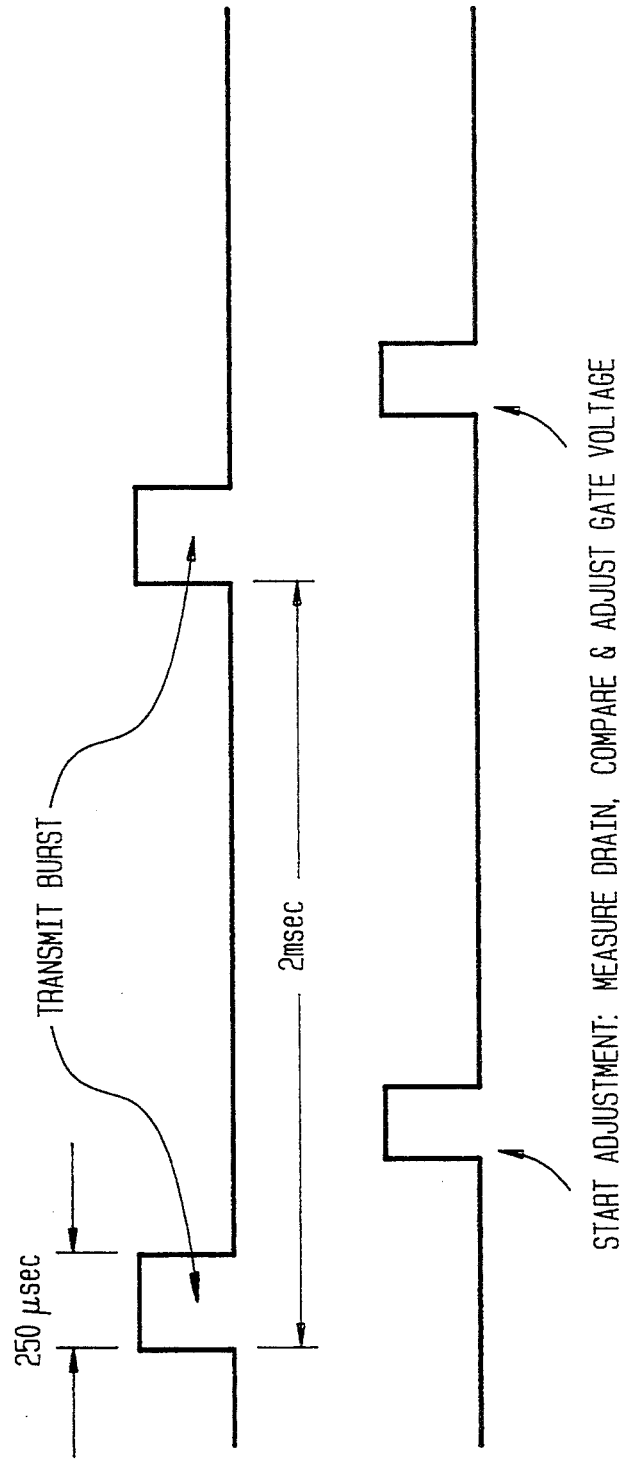
FIG. 3 is a timing diagram showing the relationship between the "on" and "off" transmit periods of one of the portable units in the system of FIG. 1.

FIG. 3 is a timing diagram showing the periods of burst uplink transmission by a portable handset relative to the period of the digital frame. As can be noted, the length of the transmit burst, equal to one time-slot of the frame, is shown as 250 $\mu\mu$sec within a frame period of 2 msec. During the time-slots in which the portable does not transmit, the transmitter is normally switched "off" to save power. In accordance with the present invention, during the interval of such non-transmit time-slots and normally amplifier "off" period, the amplifier is turned "on", with no input power present at its input, and the quiescent drain current is measured and adjusted by varying the gate bias voltage.

With reference again to FIG. 2, the internal clock 209 of the portable unit, which is linked to a network control clock (not shown) for the entire wireless communications system, determines the timing of the portable transmit time-slot for transmission of a burst and thus, when the amplifier 203 should be turned "off" after the transmission time-slot to conserve power. Clock 209, connected to the portable handset unit's microprocessor 210, also signals microprocessor 210 at a fixed time after each burst to again turn amplifier 203 "on" and sample the drain current, $I_{DO}$, for no applied input power. The quiescent drain current is measured by measuring the voltage drop across a small resistor 211 placed in series with the drain 205. This voltage is converted by A/D (analog-to-digital) converter 214 into digital format for inputting to the handset's microprocessor 210, which processes the measured voltage, converts it to a drain current, compares the drain current with a desired value, and outputs a digital control signal on lead(s) 213. This digital control signal is inputted to D/A (digital-to-analog) converter 212, which outputs an analog control signal, which is inputted to gate bias control circuit 204. If the measured quiescent drain current is too high, the control signal applied to gate bias control 204 adjusts the gate bias voltage of amplifier 203 toward cutoff to reduce the drain current. If the measured quiescent drain current control is too low, the gate bias control 204 adjusts the gate bias voltage of amplifier 203 away from cutoff to increase the drain current. Using the described quiescent drain current-to-gate bias voltage control feedback arrangement, therefore, the bias point of amplifier 204 can be maintained at an optimum level for maximum efficiency and linearity regardless of temperature changes, aging effects, and device-to-device variations.

As aforenoted, attenuator 202 attenuates the RF signal input on lead 201 to control the power input and thus power output of amplifier 203. Attenuator 202 is controlled by microprocessor 210 through D/A converter 202. The multi-aforenoted copending patent application, Ser. No. 010,111 describes a method and apparatus for dynamic power control that is useful for mitigating interference and reducing battery drain in the portable units of a TDM/TDMA wireless communications system. As described in that application, the power output of the portable is adjusted upward or downward each frame in accordance with a power control bit transmitted downlink by the port and which is determined as a function of three parameters measured by the port. Thus, rather than adjust the output of amplifier 203 each frame in accordance with such a received power bit, attenuator 202 adjusts the power input to amplifier 203 upwards and downwards in response to that received power bit, which is processed by microprocessor 210. Advantageously, as the input power to amplifier 203 is lowered to respond to the need for lower power, power dissipation also decreases. Since the drain current of amplifier 203 can also be measured during transmission of the burst, the power control of attenuator 202 can also be used to compensate for a variation in the transistor gain.

Although described in connection with a transmitter in the portable handset unit of a low power wireless communications system, the adaptive class AB amplifier of the present invention can be used in any situation in which the amplifier has periods of transmission interspersed with periods of inactivity. During the periods of inactivity the bias can thus be adjusted based on a measure of the quiescent drain current.

The above-described embodiment is illustrative of the principles of the present invention. Other embodiments could be devised by those skilled in the art without departing from the spirit and scope of the present invention.

What is claimed is:

1. An adaptive class AB amplifier for amplifying an input signal that has periods of activity and periods of inactivity comprising:

class AB amplifier means comprising at least one FET for amplifying the input signal;

measuring means for measuring the drain current of said at least one FET of said class AB amplifier means during a period of inactivity of the input signal;

comparing means for comparing the drain current measured during a period of input signal inactivity with a reference quiescent drain current value that keeps the amplifier slightly "on"; and adjusting means for adjusting the drain current of said at least one FET of said class AB amplifier means during a period of input signal inactivity so that it moves toward the reference quiescent drain current value.

2. An adaptive class AB amplifier in accordance with claim 1 wherein said measuring means measures the drain current of said at least one FET during each period of inactivity of the input signal, said comparing means compares the measured drain current in each period of input signal inactivity with a reference quiescent drain current value, and said adjusting means adjusts the drain current toward the reference quiescent drain current during each period of input signal inactivity.

3. An adaptive class AB amplifier in accordance with claim 2 wherein said adjusting means comprises means for varying the gate bias voltage of said amplifying means.

4. An adaptive class AB amplifier in accordance with claim 1 wherein the input signal is an RF (radio frequency) signal.

5. In a mobile portable handset unit in a TDM/TDMA digital telephony system which transmits an RF (radio frequency) burst signal at an uplink frequency during an assigned time-slot within a frame to a fixed port within the system and does not transmit during the period within the frame outside the assigned time-slot, adaptive apparatus for amplifying a modulated RF burst input signal to a power level for transmission, the adaptive apparatus comprising:

class AB amplifier means comprising at least one FET for amplifying the modulated RF burst input signal;

measuring means for measuring the drain current of said at least one FET of said class AB amplifier means during the period within a frame that is outside the assigned time-slot of the burst;

comparing means for comparing the drain current measured during the period within a frame outside the assigned time-slot of the burst with a reference quiescent drain current value that keeps the amplifier slightly "on"; and adjusting means for adjusting the drain current of said at least one FET of said class AB amplifier means during the period within a frame outside the assigned time-slot of the burst so that it moves toward the reference quiescent drain current value.

6. Adaptive apparatus in accordance with claim 5 wherein said measuring means measures the drain current of said at least one FET during the period within each frame that is outside the assigned time-slot of the burst, said comparing means compares with a reference quiescent drain current the measured drain current in each period within each frame that is outside the assigned time-slot of the burst, and said adjusting means adjusts the drain current toward the reference quiescent drain current during each period within each frame that is outside the assigned time-slot of the burst.

7. Adaptive apparatus AB in accordance with claim 6 wherein said adjusting means comprises means for varying the gate bias voltage of said amplifying means.

8. In a mobile portable handset unit in a TDM/TDMA digital telephony system which transmits an RF (radio frequency) burst signal at an uplink frequency during an assigned time-slot within a frame to a fixed port within the system and does not transmit during the period within the frame outside the assigned time-slot, a method for adjusting the bias of a class AB amplifier in the handset unit which amplifies a modulated RF burst input signal to a power level for transmission and which comprises at least one FET, the method comprising the steps of:

measuring the drain current of the at least one FET of the class AB amplifier during the period within a frame that is outside the assigned time-slot of the burst;

comparing the drain current measured during the period within a frame outside the assigned time-slot of the burst with a reference quiescent drain current value that keeps the amplifier slightly "on"; and adjusting the drain current of the at least one FET of the class AB amplifier during the period within a frame outside the assigned time-slot of the burst so that it moves toward the reference quiescent drain current value.

9. The method of claim 8 wherein the drain current of the at least one FET is measured during the period within each frame that is outside the assigned time-slot of the burst, the reference quiescent drain current is compared with the measured drain current in each period within each frame that is outside the assigned time-slot of the burst, and the drain current is adjusted toward the reference quiescent drain current during each period within each frame that is outside the assigned time-slot of the burst.

10. The method of claim 9 wherein the step of adjusting the drain current comprises varying the gate bias voltage of the class AB amplifier.

* * * * *